(12) United States Patent
Ueno et al.

(10) Patent No.: US 7,256,722 B2
(45) Date of Patent: Aug. 14, 2007

(54) D/A CONVERTER

(75) Inventors: Masayuki Ueno, Chuba (JP);
Masatoshi Takada, Chuba (JP);
Tatsuyuki Araki, Yokohama (JP)

(73) Assignee: Kawasaki Microelectronics, Inc., Chiba (JP)

( * ) Notice: Subject to any disclaimer, the term of this patent is extended or adjusted under 35 U.S.C. 154(b) by 0 days.

(21) Appl. No.: 11/406,269

(22) Filed: Apr. 19, 2006

(65) Prior Publication Data
US 2006/0244646 A1 Nov. 2, 2006

(30) Foreign Application Priority Data
Apr. 28, 2005 (JP) ............... 2005-131179

(51) Int. Cl.
*H03M 1/66* (2006.01)
(52) U.S. Cl. ................... 341/144; 341/135
(58) Field of Classification Search ........... 341/135, 341/144; 345/76
See application file for complete search history.

(56) References Cited

U.S. PATENT DOCUMENTS 5,703,587 A * 12/1997 Clark et al. ............. 341/144
5,838,271 A * 11/1998 Park ....................... 341/144
6,052,074 A * 4/2000 Iida ........................ 341/135
6,498,575 B2 * 12/2002 Matsusaka ............... 341/144
2005/0073486 A1 * 4/2005 Maede et al. ............ 345/76

OTHER PUBLICATIONS

J. Bastos et al., "A 12-Bit Intrinsic Accuracy High-Speed CMOS DAC", *IEEE Journal of Solid-State Circuits*, vol. 33, No. 12, Dec. 1998, pp. 1959-1969.
H. Takakura et al., "A 10 Bit 80MHz Glitchless CMOS D/A Converter", *IEEE 1991 Custom Integrated Circuits Conference*, pp. 26.5.1-26.5.4, month unknown.

* cited by examiner

*Primary Examiner*—Jean Bruner Jeanglaude
(74) *Attorney, Agent, or Firm*—Oliff & Berridge, PLC

(57) ABSTRACT

A high accuracy D/A converter includes D/A converter sections including 64 current cells for outputting a current corresponding to 1 LSB of 8-bit input data and a D/A converter section including 63 current cells, a reference current generating section for supplying the respective D/A converter sections with reference currents, and a decoder for activating each of the current cells from the D/A converter sections to the D/A converter section in the stated order in a cyclic manner when the 8-bit input data value is increased, and deactivating one each of the activated current cells from the D/A converter section to the D/A converter section in the stated order in a cyclic manner when the 8-bit input data value is decreased.

5 Claims, 5 Drawing Sheets

FIG. 2

|     | X1  | X2  | X3  | X4  | X5  | X6  | X7  | X8  | X9  | X10 | X11 | X12 | X13 | X14 | X15 | X16 |
|-----|-----|-----|-----|-----|-----|-----|-----|-----|-----|-----|-----|-----|-----|-----|-----|-----|
| Y16 | 145 | 177 | 193 | 225 | 233 | 201 | 185 | 153 | 157 | 189 | 205 | 237 | 229 | 197 | 181 | 149 |
| Y15 | 161 | 65  | 81  | 113 | 121 | 89  | 73  | 169 | 173 | 77  | 93  | 125 | 117 | 85  | 69  | 165 |
| Y14 | 209 | 97  | 26  | 57  | 49  | 17  | 105 | 217 | 221 | 109 | 21  | 53  | 61  | 30  | 101 | 213 |
| Y13 | 241 | 129 | 42  | 1   | 9   | 33  | 137 | 249 | 253 | 141 | 37  | 13  | 5   | 46  | 133 | 245 |
| Y12 | 250 | 138 | 34  | 10  | 2   | 41  | 130 | 242 | 246 | 134 | 45  | 6   | 14  | 38  | 142 | 254 |
| Y11 | 218 | 106 | 18  | 50  | 58  | 25  | 98  | 210 | 214 | 102 | 29  | 62  | 54  | 22  | 110 | 222 |
| Y10 | 170 | 74  | 90  | 122 | 114 | 82  | 86  | 162 | 166 | 70  | 86  | 118 | 126 | 94  | 78  | 174 |
| Y9  | 154 | 186 | 202 | 234 | 226 | 194 | 178 | 146 | 150 | 182 | 198 | 230 | 238 | 206 | 190 | 158 |
| Y8  | 160 | 192 | 208 | 240 | 232 | 200 | 184 | 152 | 148 | 180 | 196 | 228 | 236 | 204 | 188 | 156 |
| Y7  | 176 | 80  | 96  | 128 | 120 | 88  | 72  | 168 | 164 | 68  | 84  | 116 | 124 | 92  | 76  | 172 |
| Y6  | 224 | 112 | 24  | 56  | 64  | 31  | 104 | 216 | 212 | 100 | 27  | 60  | 52  | 20  | 108 | 220 |
| Y5  | ■   | 144 | 40  | 16  | 8   | 47  | 136 | 248 | 244 | 132 | 43  | 4   | 12  | 36  | 140 | 252 |
| Y4  | 247 | 135 | 48  | 7   | 15  | 39  | 143 | 255 | 251 | 139 | 35  | 11  | 3   | 44  | 131 | 243 |
| Y3  | 215 | 103 | 32  | 63  | 55  | 23  | 111 | 223 | 219 | 107 | 19  | 51  | 59  | 28  | 99  | 211 |
| Y2  | 167 | 71  | 87  | 119 | 127 | 95  | 79  | 175 | 171 | 75  | 91  | 123 | 115 | 83  | 67  | 163 |
| Y1  | 151 | 183 | 199 | 231 | 239 | 207 | 191 | 159 | 155 | 187 | 203 | 235 | 227 | 195 | 179 | 147 |

D/A CONVERTER

BACKGROUND

The present invention relates to a D/A converter for converting a digital signal to an analog signal.

The paper by Jose Bastos, Augusto M. Marques, Michel S. J. Steyaert, and Willy Sansen, "A 12-bit Intrinsic Accuracy High-Speed CMOS DAC", IEEE JOURNAL OF SOLID-STATE CIRCUITS, VOL. 33, NO. 12, DECEMBER, p. 1959, 1998 (Non-Patent Document 1) and the paper by Hiroshi Takakura, Masashige Yokoyama, and Akira Yamaguchi, "A 10 bit 80 MHz Glitchless CMOS D/A Converter", IEEE 1991 CUSTOM INTEGRATED CIRCUITS CONFERENCE (Non Document 2) each disclose a D/A converter for converting a multi-bit digital signal into an analog signal.

Non-Patent Document 1 discloses a D/A converter having a layout construction shown in FIG. 3 in the case where input data is composed of 8 bits, for example. Here, four of 6-bit D/A converter sections 11 to 14 are arranged and reference currents Iref1 to Iref4 generated by a reference current generating section 15 are supplied to the D/A converter sections. Data of the lower 6 bits of the 8-bit input data is input to the 6-bit D/A converter sections 11 to 14 and data of the upper 2 bits thereof is used to select the 6-bit D/A converter sections 11 to 14, whereby a total output current thus obtained is subjected to voltage conversion to take out an analog signal.

FIG. 4 is a block diagram showing an entire configuration of the 8-bit D/A converter. The 6-bit D/A converter section 11 is provided with 64 current cells 11a respectively composed of a differential circuit formed by PMOS transistors MP11 to MP13 for generating an analog signal corresponding to 1 LSB. In addition, the 6-bit D/A converter section 11 is provided with a PMOS transistor MP14 for applying to these 64 current cells a common bias voltage. Similarly, the D/A converter sections 12 and 13 have the above-mentioned configuration. The D/A converter section 14 has the same configuration except that the number of current cells is smaller by one, that is, 63 current cells. The reference current generating section 15 is composed of NMOS transistors MN11 to MN14 whose gates are applied with a bias voltage VB. The NMOS transistors MN11 to MN14 supply currents Iref1 to Iref4 to the PMOS transistors MP14 in the respective D/A converter sections 11 to 14. The decoder 16 receives the 8-bit data as an input to generate and output four decoding signals for the D/A converter sections 11 to 14 using the upper 2 bits, thereby selecting one of the four D/A converter sections. Then, using the lower 6 bits, the decoder generates and outputs 64 or 63 decoding signals to operate the current cells of the respective D/A converter sections. Reference symbols R11 and R12 denote output resistances for converting the total output current into a voltage.

The D/A converter shown in FIG. 4 selects the D/A converter section 11 when the upper 2 bits of the 8-bit input data is in the configuration "00". Here, when the lower 6 bits of the input data is in the configuration "000000", although the D/A converter section 11 has been selected, all the current cells are deactivated because the transistor MP11 is turned off and the transistor MP12 is turned on. Accordingly, no current flows through the resistance R11 and an output voltage VoutP is 0.

When the lower 6 bits are in the configuration "000001", one of the 64 current cells in the D/A converter section 11 is applied with a signal corresponding to 1 LSB. The transistor MP11 of the thus applied cell is turned on and the transistor MP12 is turned off, whereby the cell is activated. As the positive phase current of the cell becomes Iref1, the current Iref1 flows through the output resistance R11.

When the lower 6 bits are in the configuration "111111", all the 64 current cells in the D/A converter section 11 are activated. As each of the positive phase currents becomes Iref1, the current 64×Iref1 flows through the output resistance R11.

When the upper 2 bits of the 8-bit input data are in the configuration "01", the D/A converter sections 11 and 12 are selected. At that point, all the 64 current cells in the D/A converter section 11 are activated and each cell outputs the positive phase output current Iref1. Thus, the total output current becomes 64×Iref1. Also, the current cells in the D/A converter section 12 are activated by the number according to a code of the lower 6 bits of the 8-bit input data and each of the positive phase currents becomes Iref2. For example, when the lower 6 bits are in the configuration "000000", all the current cells in the D/A converter section 12 are deactivated. When the lower 6 bits are in the configuration "000001", one current cell is activated and the positive phase current becomes Iref2.

As a result, the current 64×Iref1+Iref2 flows through the output resistance R11.

When the upper 2 bits of the 8-bit input data are in the configuration "10", the D/A converter sections 11, 12, and 13 are selected. When the upper 2 bits are in the configuration "11", all the D/A converter sections 11, 12, 13, and 14 are selected. In this state, a current obtained by adding positive phase output currents and output from the respective D/A converter sections 11 to 14 is converted by the resistance R11 into a voltage, thereby obtaining the output voltage VoutP. In the case where the condition Iref1=Iref2=Iref3=Iref4=I is satisfied, when the 8-bit input data is in the configuration "00000000", the output voltage VoutP is 0. When the 8-bit input data is in the configuration "11111111", the output voltage VoutP is 255I×R11.

In this D/A converter, as the respective D/A converter sections 11 to 14 are operated on the basis of the 6-bit input code, the digital circuit can be simplified. In addition, as the number of the current cells in the respective D/A converter sections 11 to 14 is 63 or 64, matching of the current cells in the respective D/A converter sections 11 to 14 can be achieved more easily. Furthermore, in the reference current generating section 15 as well, matching can be achieved more easily by arranging the NMOS transistors MN11 to MN14 close to one another.

On the other hand, Non-Patent Document 2 discloses a D/A converter in which, when input data is composed of 8 bits, for example, 255 current cells are arranged in an array, and the current cells are read out in accordance with the input code to add the thus obtained currents for voltage conversion.

However, it is desirable for the D/A converters shown in FIGS. 3 and 4 that reference currents are equal to one another to satisfy the condition Iref1=Iref2=Iref3=Iref4, but there are minute variations among the reference currents in practice. Thus, for example, assuming Iref1=Iref2<Iref3=Iref4 and the respective D/A converter sections 11 to 14 are uniform, a digital-analog conversion characteristic shown in FIG. 5 is obtained. In this way, the condition about so called differential non-linearity errors (DNL) is satisfactory. However, in the D/A converter sections 11 and 12, where the low level to intermediate level area is subjected to the conversion, the bit size is small (conversion gain is small), and in the D/A converter sections 13 and 14 where the intermediate level to high level area is subjected to the conversion, the bit size is large in turn (conversion gain is large). Therefore, so called integral non-linearity errors (INL) becomes worse. In particular, in a semiconductor process paying no attention to the matching of the current cells, when the relation INL<1 LSB is required, it is only possible to obtain a D/A converter requiring about 10-bit resolution.

Meanwhile, with the method of Non-Patent Document 2, as a bit with a large bit size and a bit with a small bit size are alternately output in sequence, the errors are not accumulated too much. Thus, the integral non-linearity errors become smaller but distances of the bits that are output in sequence are relatively far, whereby the differential non-linearity errors become larger as shown in FIG. 6.

SUMMARY

Accordingly, a D/A converter capable of improving both the characteristics of the integral non-linearity errors and the differential non-linearity errors generated in the above-mentioned related-art D/A converter, thereby achieving the high accuracy of the D/A converter, is provided.

According to an exemplary embodiment of the present invention, there is provided a D/A converter, including: first to M-th D/A converter sections in which $2^{N-1}$ current cells for outputting a current corresponding to 1 LSB of N-bit input data upon activation are allocated by almost the same number of the current cells, the D/A converter outputting an added value of currents output from activated current cells in the respective D/A converter sections, or outputting a voltage obtained by subjecting the added value of the currents to voltage conversion; a reference current generating section for supplying each of the D/A converter sections with a reference current; and a decoder for activating the current cells from the first to M-th D/A converter sections in the stated order in a cyclic manner when a value of the N-bit input data is increased, and for deactivating the activated current cells from the M-th to first D/A converter sections in the stated order in a cyclic manner when the value of the N-bit input data is decreased.

Here, the maximum value of the number of the current cells to be continuously activated or continuously deactivated in the respective D/A converter sections may be limited to a number smaller than the number of all the current cells in the respective D/A converter sections.

Furthermore, the maximum value of the number of current cells to be continuously activated or continuously deactivated in the respective D/A converter sections may be set larger as a permissible value for variations in the reference currents generated in the reference current generating section for the respective D/A converter sections is larger.

With the D/A converter according to various exemplary embodiments of the present invention, when the value of the input data is increased, for example, current cells in a plurality of D/A converter sections may be activated in sequence in a cyclic manner, unlike the related art where after the current cells in one D/A converter section are all activated, current cells in the next D/A converter section are activated. For example, in various exemplary embodiments, as the number of the current cells to be continuously activated in one D/A converter section is limited to 1 or more, and activation is shifted to current cells in the next D/A converter section, even when there are variations in the reference currents supplied to the respective D/A converter sections, accumulation of errors due to the variations is very little if any. Thus, it is possible to significantly improve the integral non-linearity errors, and at the same time the differential non-linearity errors are still small. As a result, it is possible to realize a good performance on the D/A converter mentioned above.

BRIEF DESCRIPTION OF THE DRAWINGS

FIG. 2 shows D/A converter sections 1 to 4 constituting the D/A converter according to an embodiment of the present invention;

DETAILED DESCRIPTION OF EMBODIMENTS

Figure 1:
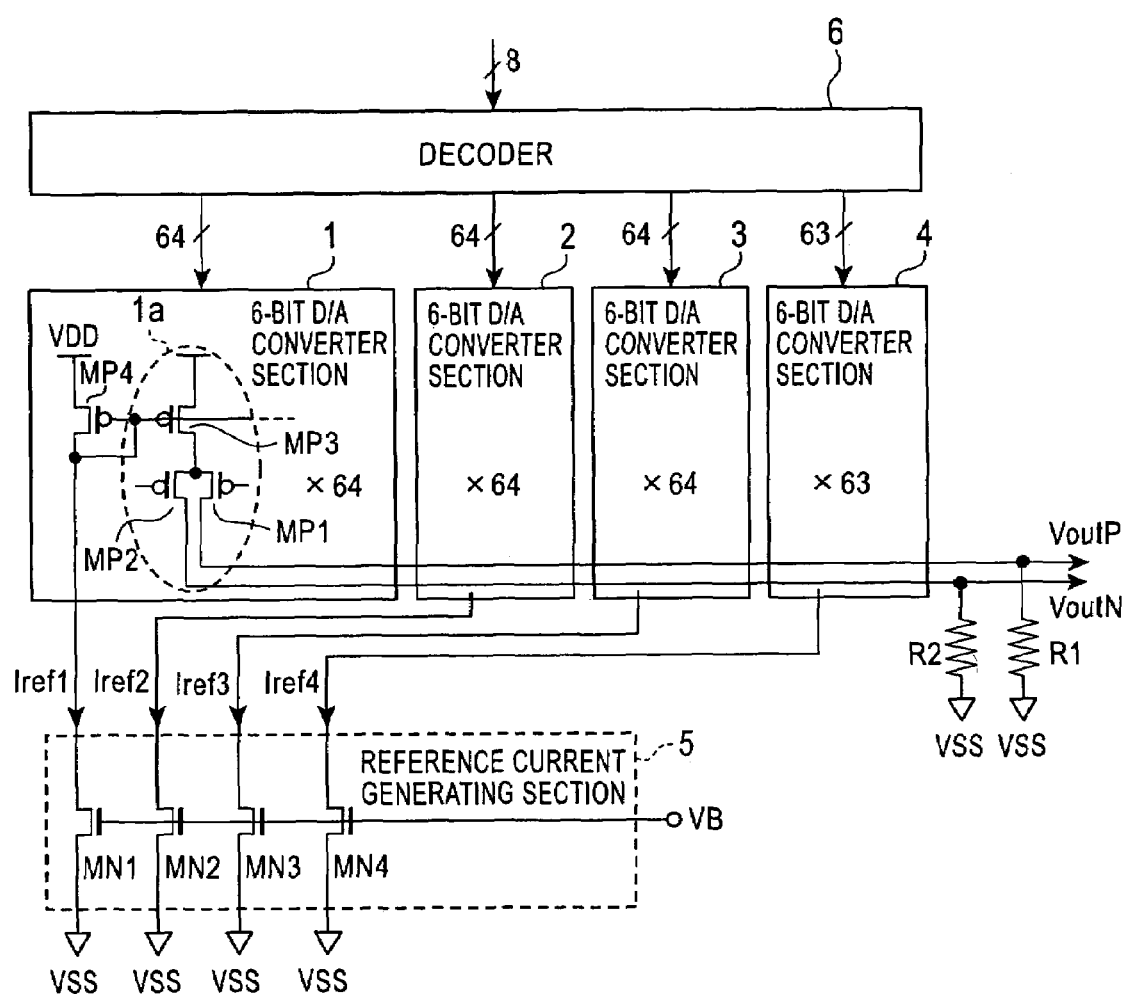
FIG. 1 is a block diagram of a configuration of a D/A converter according to an exemplary embodiment of the present invention.
Figure 3:
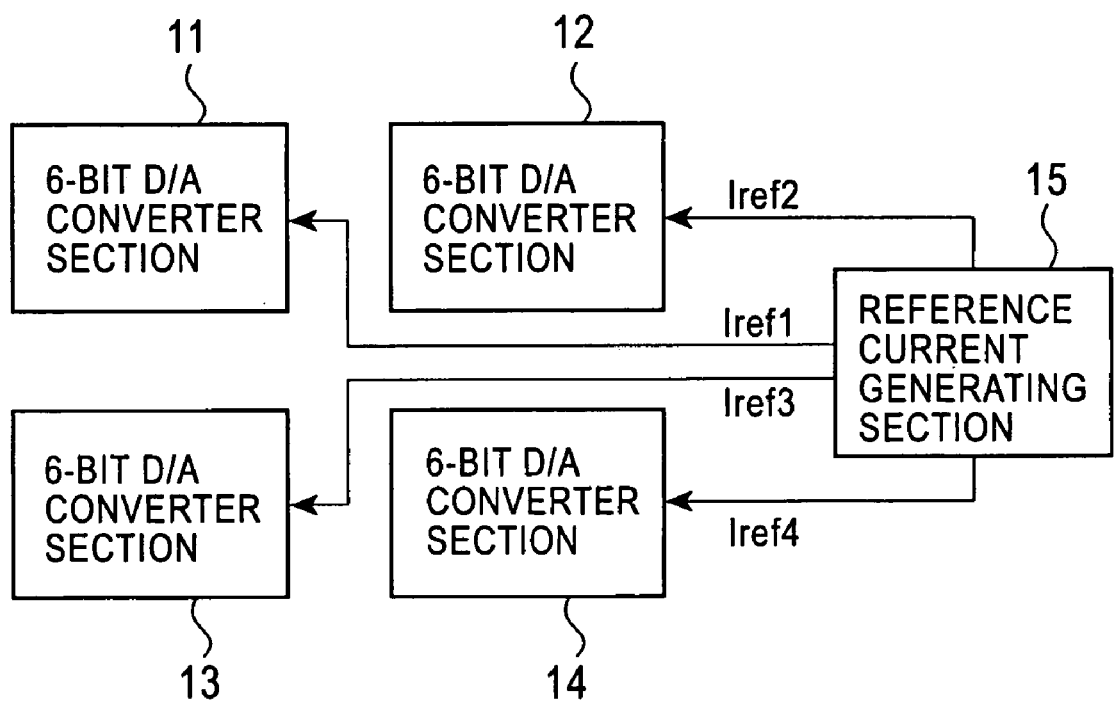
FIG. 3 is a diagram for describing a layout of a D/A converter of a related art example.
Figure 4:
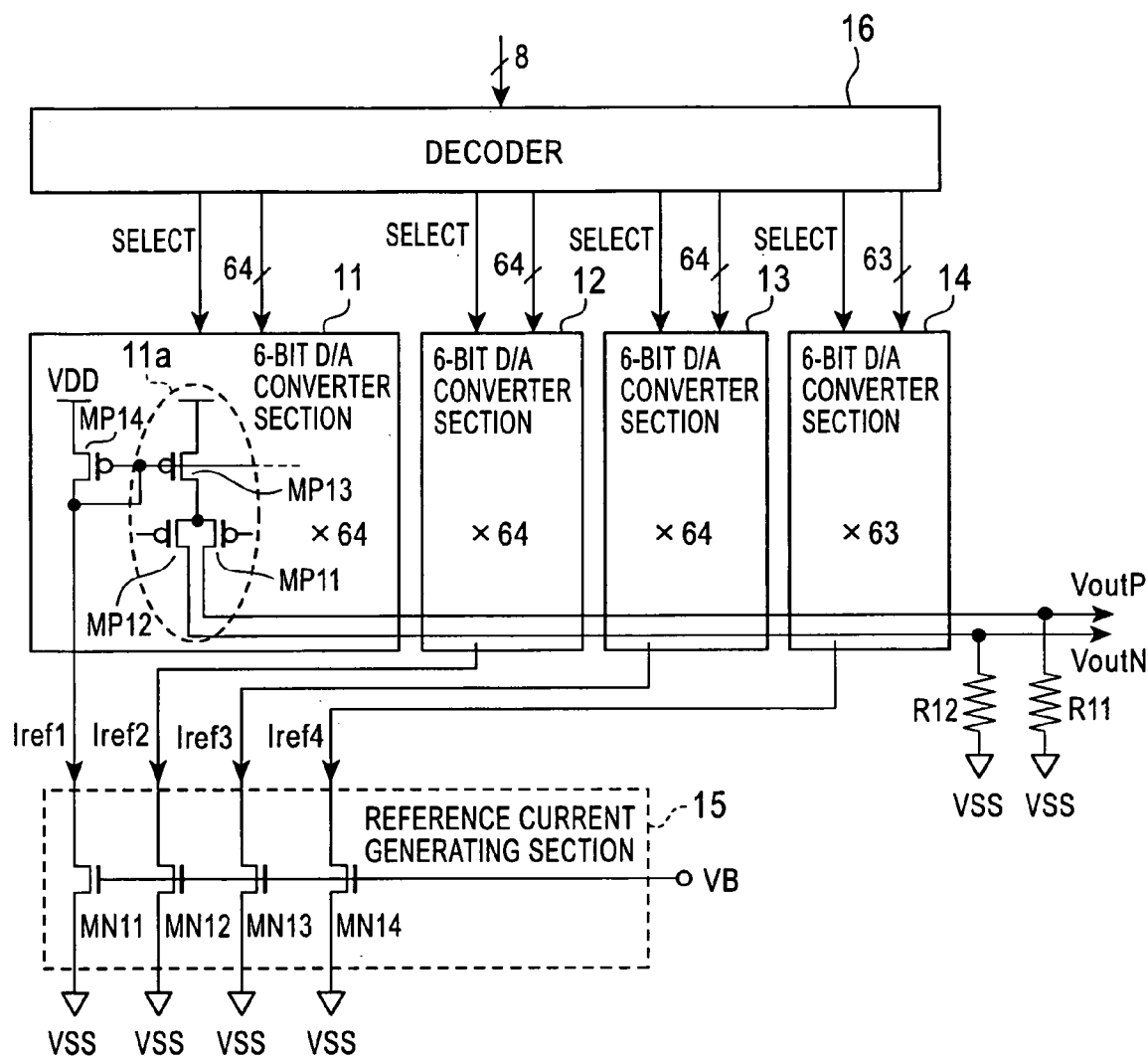
FIG. 4 is a block diagram of a configuration of the D/A converter of a related art example.
Figure 5:
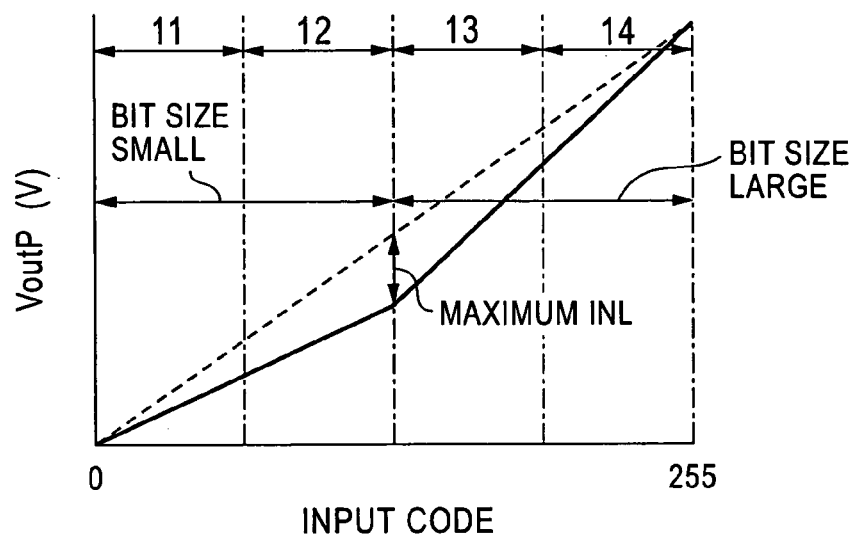
FIG. 5 shows a conversion characteristic of the D/A converter shown in FIG. 4.
Figure 6:
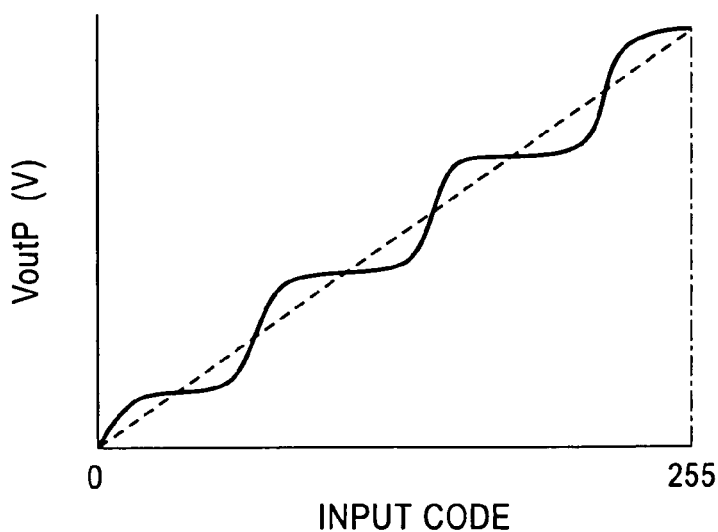
FIG. 6 shows a conversion characteristic of a D/A converter of another related art example.

FIG. 1 is a block diagram of a configuration of an 8-bit data input D/A converter according to an exemplary embodiment of the present invention. Reference numerals 1 to 4 denote 6-bit D/A converter sections, reference numeral 5 denotes a reference current generating section, reference numeral 6 denotes a decoder for receiving 8-bit data as an input to decode the data, and reference symbols R1 and R2 denote output resistances.

According to various exemplary embodiments, the 6-bit D/A converter section 1 may be provided with 64 current cells 1a respectively composed of a differential circuit formed by PMOS transistors MP1 to MP3 for generating an analog signal corresponding to 1 LSB. In addition, the 6-bit D/A converter section 1 may be provided with a PMOS transistor MP4 for applying a common bias voltage to these 64 current cells. Similarly, the D/A converter sections 2 and 3 may have the above-mentioned configuration. According to various exemplary embodiments, the D/A converter section 4 may have the same configuration, except that the number of current cells may be 63. According to various exemplary embodiments, the reference current generating section 5 may be composed of NMOS transistors MN1 to MN4 whose gates are applied with a bias voltage VB. The NMOS transistors MN1 to MN4 may supply reference currents Iref1 to Iref4 to the PMOS transistor MP4 in the respective D/A converter sections 1 to 4. The decoder 6 may receive 8-bit data as an input, may output 64 signals corresponding to 1 LSB to the respective D/A converter sections 1 to 3, and may output 63 signals to the D/A converter section 4.

According to various exemplary embodiments, when the 8-bit input data is in the configuration "00000000", the decoder 6 may turn off the transistors MP1 of all the current cells in the D/A converter sections 1 to 4 and may turn on the transistors MP2 to deactivate all the current cells. Thus, no current flows through the resistance R1 and an output voltage VoutP is 0.

According to various exemplary embodiments, when the 8-bit input data is in the configuration "00000001", the decoder 6 may turn on the transistor the MP1 of one current cell in the D/A converter section 1 and may turn off the transistor MP2 for achieving activation. A current Iref1 flows through the resistance R1 and the output voltage VoutP is Iref1×R1.

According to various exemplary embodiments, when the 8-bit input data is in the configuration "00000010", each one of the current cells in the D/A converter sections 1 and 2 is activated. The current Iref1 and a current Iref2 flow through the resistance R1 and the output voltage VoutP is (Iref1+Iref2)×R1.

According to various exemplary embodiments, when the 8-bit input data is in the configuration "00000011", each one of the current cells in the D/A converter sections 1, 2, and 3 is activated. The current Iref1, the current Iref2, and a current Iref3 flow through the resistance R1 and the output voltage VoutP is (Iref1+Iref2+Iref3)×R1.

According to various exemplary embodiments, when the 8-bit input data is in the configuration "00000100", each one of the current cells in the D/A converter sections 1, 2, 3, and 4 is activated. The current Iref1, the current Iref2, the current Iref3, and a current Iref4 flow through the resistance R1 and the output voltage VoutP is (Iref1+Iref2+Iref3+Iref4)×R1.

According to various exemplary embodiments, when the 8-bit input data is in the configuration "00000101", two of the current cells in the D/A converter section 1 and each one of the current cells in the D/A converter sections 2, 3, and 4 are activated. A current 2Iref1, the current Iref2, the current Iref3, and the current Iref4 flow through the resistance R1 and the output voltage VoutP is (2Iref1+Iref2+Iref3+Iref4)×R1.

Hereinafter, similarly, as the 8-bit input data is increased by 1 LSB, the number of the current cells to be activated in the D/A converter sections 1→2→3→4→1→ . . . in the stated order in a cyclic manner may be increased by one each. The current flowing through the resistance R1 may be accordingly increased. On the other hand, when the 8-bit input data is decreased by 1 LSB, at each time, the number of the current cells to be deactivated in the D/A converter sections 4→3→2→1→4→ . . . in the stated order in a cyclic manner may be increased by one. The current flowing through the resistance R1 may be accordingly decreased.

In this way, the current cells to be activated on the basis of the change in the 8-bit input data may be changed in the D/A converter sections 1 to 4 in sequence in a cyclic manner, or alternatively changed in the D/A converter sections 4 to 1 in sequence (that is, reverse sequence) in a cyclic manner. Therefore, even when there are some variations in the reference currents Iref1, Iref2, Iref3, and Iref4, most of the integral non-linearity errors are reduced. Also, the condition about the differential non-linearity errors become better.

It should be noted that in the embodiment described above, when the 8-bit input data is increased by 1 LSB again after the data has been increased by 1 LSB, one current cell in the next D/A converter section may be activated. However, after several current cells in one D/A converter section have been continuously activated, when the data is changed by 1 LSB, the current cells in the next D/A converter section may be activated. The maximum value of the number of the current cells to be continuously activated or continuously deactivated in the same D/A converter section may be smaller than the number of all the current cells in the D/A converter section. The setting may be performed in accordance with a permissible value for the variations in the reference currents Iref1, Iref2, Iref3, and Iref4. For example, when the permissible value is large, the maximum value of the number of the current cells to be continuously activated or continuously deactivated in one D/A converter section may be set large, and when the permissible value is small, the maximum value of the number of the current cells may be set small.

FIG. 2 shows the D/A converter sections 1 to 4 constituting the D/A converter according to an exemplary embodiment of the present invention. The D/A converter sections 1 to 4 may be composed of total 8-bit current cells. In the D/A converter sections 1 to 3, 64 current cells may be arranged. In the D/A converter section 4, 63 current cells may be arranged. In the example shown in FIG. 2, Y1 to Y16 on the left-hand side in FIG. 2 represent vertical positions of the current cells and X1 to X16 on the lower side represent lateral positions of the current cells. Therefore, 64 current cells at X1 to X8 and Y9 to Y16 on the upper left side in FIG. 2 may be arranged in the D/A converter section 1, 64 current cells at X9 to X16 and Y1 to Y8 on the lower right side may be arranged in the D/A converter section 2, 64 current cells at X9 to X16 and Y9 to Y16 on the upper right side may be arranged in the D/A converter section 3, and 63 current cells at X1 to X8 and Y1 to Y8 on the lower left side in the drawing are arranged in the D/A converter section 4. It should be noted that the current cell located at X1, Y5 in the D/A converter section 4 may also not be selected.

Hereinafter, with reference to FIGS. 1 and 2, a selection of the current cells (activation and deactivation) will be described according to this exemplary embodiment. The decoder 6 may select current cells on the basis of numbers given to the current cells shown in FIG. 2. That is, when the 8-bit input data is in the configuration "00000000", the decoder 6 turns off the transistors MP1 of all the current cells in the D/A converter sections 1 to 4 and turns on the transistors MP2 to deactivate all the current cells. Thus, no current flows through the resistance R1 and the output voltage VoutP is 0.

According to various exemplary embodiments, when the 8-bit input data is in the configuration "00000001", the decoder 6 may turn on the transistor MP1 of a current cell 1 in the D/A converter section 1 and may turn off the transistor MP2 for achieving the activation. The current Iref1 flows through the resistance R1 and the out put voltage VoutP is Iref1×R1.

According to various exemplary embodiments, when the 8-bit input data in the configuration "00000010", current cells 1 and 2 in the D/A converter section 1 may be activated. The current 2Iref1 flows through the resistance R1 and the output voltage VoutP is (2Iref1)×R1.

According to various exemplary embodiments, when the 8-bit input data is in the configuration "00000011", the current cells 1 and 2 in the D/A converter section 1 and a current cell 3 in the D/A converter section 2 may be activated. The twofold current 2Iref1 and the current Iref2 flow through the resistance R1 and the output voltage VoutP is (2Iref1+Iref2)×R1.

According to various exemplary embodiments, when the 8-bit input data is in the configuration "00000100", a current cell 4 in the D/A converter section 2 may be further activated. The current 2Iref1 and a current Iref2 flow through the resistance R1 and the output voltage VoutP is VoutP=(2Iref1+2Iref2)×R1.

According to various exemplary embodiments, when the 8-bit input data is in the configuration "00000101", the current cells 1 and 2 in the D/A converter section 1, the current cells 3 and 4 in the D/A converter section 2, and a current cell 5 in the D/A converter section 3 may be activated. The current 2Iref1, the current 2Iref2, and a current Iref3 flow through the resistance R1 and the output voltage VoutP is VoutP=(2Iref1+2Iref2+Iref3)×R1.

Hereinafter, similarly, as the 8-bit input data is increased by 1 LSB, the number of current cells to be activated in the D/A converter sections 1→1→2→2→3→3→4→4→1→1→ . . . may be increased by one each in the stated order in a cyclic manner, and the current flowing through the resistance R1 may be increased. On the other hand, as the 8-bit input data is decreased by 1 LSB, at each time, the number of current cells to be deactivated in the D/A converter sections 4→4→3→3→2→2→1→1→4→4→ . . . may be increased by one in the stated order in a cyclic manner, and the current flowing through the resistance R1 may be decreased.

An exemplary method of selecting the current cells according to this embodiment includes selecting the current cells constructed in the respective D/A converter sections on the basis of point symmetry with respect to the centers of the respective converter sections. Also, among the mutual D/A converter sections, the current cells may be selected to have point symmetry. When only the D/A converter section 1 is focused, the center point may be located among the positions of the current cells at X4, X5, Y12, and Y13. In the D/A converter section 1, the current cells 1 (X4, Y13)→2 (X5, Y12)→9 (X5, Y13)→10 (X4, Y12)→17 (X6, Y14)→18 (X3, Y11)→ . . . may be selected to have point symmetry. Also, when only the D/A converter section 2 is focused, in the D/A converter section 2, the current cells 3 (X13, Y4)→4 (X12, Y5)→1 (X12, Y4)→12 (X13, Y5)→19 (X11, Y3)→20 (X14, Y6)→ . . . may be selected to have point symmetry.

As the current cells are selected to have point symmetry in the respective D/A converter sections, even when there are some variations in the reference currents Iref1, Iref2, Iref3, and Iref4, most of the integral non-linearity errors are eliminated and the condition of the differential non-linearity errors is greatly enhanced.

Moreover, as in the above-mentioned embodiment, the current cells may be selected to have point symmetry in the D/A converter sections 1 and 2 (in other words, directions for selecting the current cells in the D/A converter sections 1 and 2 are opposed to each other). In this way, the current cells may be selected to have point symmetry in the respective D/A converter sections, and at the same time the current cells may be selected to have point symmetry among the mutual D/A converter sections, whereby even when there are some variations in the reference currents Iref1, Iref2, Iref3, and Iref4, it is possible to further suppress the integral non-linearity errors and the differential non-linearity errors.

In the above-mentioned exemplary embodiment, the example has been described in which the current cells are selected to have point symmetry in the D/A converter section, and at the same time the current cells are selected to have point symmetry among the mutual D/A converter sections, but the method of selecting the current cells is not limited to the above method. For example, it is possible that the current cells in the respective D/A converter sections may be divided by the same number in the right and left sides, or the upper and lower sides for the sake of convenience, and the current cells may be selected to have line symmetry with respect to the border of the thus divided current cells. For example, in FIG. 2, when the D/A converter section 1 is focused, the current cells may be divided with the border of Y12 and Y13, for instance, for the sake of convenience, and after the current cell 1 is selected, the current cell 10 may be selected. After the current cell 4 in the D/A converter section 2 is selected, the current cell 11 may be selected, or alternatively, after the D/A converter section 1, the current cells 5 and 14 in the D/A converter section 3 may be sequentially selected instead of the D/A converter section 2. That is, the current cells may be selected as long as the symmetric property is accordingly maintained.

It should be noted that according to the above-mentioned exemplary embodiment, the example has been described in which the number of the D/A converter sections is set to 4 while the input data is composed of 8 bits, but of course the number of the bits for the input data is arbitrary and the number of the D/A converter sections is also arbitrarily determined. It should be noted that when the input data is N bits, the total value of the current cells for outputting a current corresponding to 1 LSB is $2^{N-1}$ and the current cells are allocated to an arbitrary number of the D/A converter sections.

What is claimed is:

1. A D/A converter, comprising:
M number of D/A converter sections in which $2^{N-1}$ current cells, each current cell outputs a current corresponding to 1 LSB of N-bit input data upon activation are allocated by substantially the same number of the current cells, the D/A converter outputting an added value of currents output from activated current cells in respective D/A converter sections or outputting a voltage obtained by subjecting to voltage conversion the added value of the currents;
a reference current generating section for supplying each of the D/A converter sections with a reference current; and
a decoder for activating at least one current cell in D/A converter section, from the first to M-th D/A converter sections in sequence in a cyclic manner when a value of the N-bit input data is increased, and deactivating at least one activated current cell in D/A converter section from the M-th to first D/A converter sections in sequence in a cyclic manner when the value of the N-bit input data is decreased, wherein a maximum value of the number of the current cells to be continuously activated or continuously deactivated in the respective D/A converter sections is limited to a number smaller than the number of all the current cells in the respective D/A converter sections.

2. The D/A converter according to claim 1, further comprising a decoder for activating the current cells in the respective D/A converter sections from each center to outside of the D/A converter sections and deactivating the current cells in the respective D/A converter sections toward each center.

3. The D/A converter according to claim 2, further comprising a decoder for activating or deactivating the current cells in the respective D/A converter sections to have point symmetry with respect to a center point among the mutual D/A converter sections.

4. The D/A converter according to claim 1, further comprising a decoder for activating or deactivating the current cells in the respective D/A converter sections to have point symmetry with respect to each center point in the D/A converter sections.

5. The D/A converter according to claim 4, further comprising a decoder for activating or deactivating the current cells in the respective D/A converter sections to have point symmetry with respect to a center among the mutual D/A converter sections.

* * * * *